United States Patent
Yasuda et al.

(10) Patent No.: US 11,863,151 B2
(45) Date of Patent: Jan. 2, 2024

(54) MULTIPLEXER

(71) Applicant: Murata Manufacturing Co., Ltd., Nagaokakyo (JP)

(72) Inventors: Junpei Yasuda, Nagaokakyo (JP); Kenichi Uesaka, Nagaokakyo (JP); Tomohisa Komura, Nagaokakyo (JP); Kentaro Funahashi, Nagaokakyo (JP); Shizuka Kawamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 368 days.

(21) Appl. No.: 17/072,089

(22) Filed: Oct. 16, 2020

(65) Prior Publication Data
US 2021/0135645 A1   May 6, 2021

(30) Foreign Application Priority Data
Oct. 31, 2019 (JP) ................. 2019-198914

(51) Int. Cl.
*H03H 7/01* (2006.01)
*H04B 1/00* (2006.01)

(52) U.S. Cl.
CPC ........ *H03H 7/0161* (2013.01); *H03H 7/1741* (2013.01); *H04B 1/0057* (2013.01)

(58) Field of Classification Search
CPC .... H03H 7/1741; H03H 7/0161; H03H 9/706; H03H 9/176; H04B 1/0057
See application file for complete search history.

(56) References Cited

U.S. PATENT DOCUMENTS

| | | | | |
|---|---|---|---|---|
| 10,587,292 B2* | 3/2020 | Elbrecht | ............. | H04B 1/0057 |
| 10,707,905 B2* | 7/2020 | Wloczysiak | ......... | H04B 1/0057 |
| 11,025,218 B2* | 6/2021 | Jo | ......... | H03H 7/1775 |
| 2005/0095998 A1* | 5/2005 | Toncich | .................. | H03H 7/20 |
| | | | | 455/107 |
| 2007/0153729 A1* | 7/2007 | Alapuranen | ......... | H04W 76/15 |
| | | | | 370/329 |
| 2012/0112850 A1* | 5/2012 | Kim | ......... | H03H 9/54 |
| | | | | 333/32 |
| 2012/0243446 A1* | 9/2012 | Mueller | ............... | H04B 1/0057 |
| | | | | 370/310 |

(Continued)

FOREIGN PATENT DOCUMENTS

JP          2005-295203 A          10/2005

*Primary Examiner* — Anh Ngoc M Nguyen
(74) *Attorney, Agent, or Firm* — Keating & Bennett, LLP

(57) ABSTRACT

A multiplexer includes a first filter circuit including a pass band that is a first frequency band, a second filter circuit including a pass band that is a second frequency band, and an additional circuit. The first filter circuit includes a first terminal connected to a common terminal and a second terminal connected to a first input/output terminal. The second filter circuit includes a third terminal connected to the common terminal and a fourth terminal connected to a second input/output terminal. The additional circuit is connected to the fourth terminal and one of the first and second terminals and includes a series-arm circuit on a series-arm path connecting the fourth terminal to the one of the terminals and a parallel-arm circuit on a parallel-arm path connecting the series-arm path to the ground. The parallel-arm circuit includes only an inductor, a capacitor, or an LC parallel-arm resonant circuit in series with the parallel-arm path.

16 Claims, 12 Drawing Sheets

(56) References Cited

U.S. PATENT DOCUMENTS

2016/0127014 A1\* 5/2016 Wloczysiak ............. H04B 1/18
                                                        375/318
2017/0302252 A1\* 10/2017 Hey-Shipton ............ H04B 1/40
2018/0226952 A1\* 8/2018 Tanaka ..................... H03H 9/72
2020/0259482 A1\* 8/2020 Khlat ..................... H03H 9/706

\* cited by examiner

EXAMPLE 1

EXAMPLE 1

COMPARATIVE EXAMPLE 2

EXAMPLE 2

MULTIPLEXER

CROSS REFERENCE TO RELATED APPLICATIONS

This application claims the benefit of priority to Japanese Patent Application No. 2019-198914 filed on Oct. 31, 2019. The entire contents of this application are hereby incorporated herein by reference.

BACKGROUND OF THE INVENTION

1. Field of the Invention

The present invention relates to a multiplexer including filter circuits.

2. Description of the Related Art

For adoption of multi-band features, recent mobile phones incorporate, immediately below an antenna, a multiplexer including filter circuits having different pass bands.

Japanese Unexamined Patent Application Publication No. 2005-295203 discloses a duplexer (multiplexer) including a receiving filter disposed between a common terminal and a reception terminal and a transmitting filter disposed between the common terminal and a transmission terminal. The transmitting filter is a low-pass filter whose first-stage resonator adjacent to the common terminal is a series-arm resonator including reflectors and an interdigital transducer (IDT). The grating pitch of each of the reflectors is smaller than the electrode-to-electrode pitch of the IDT. These features conceivably suppress ripples in the pass band of the receiving filter and thus eliminate or reduce the possibility that characteristics of the receiving filter will degrade.

However, the multiplexer disclosed in Japanese Unexamined Patent Application Publication No. 2005-295203 may or may not satisfactorily minimize entry of unwanted signals from one filter circuit into the other filter circuit, depending on, for example, the layout of the two filter circuits connected to the common terminal or the strength of radio-frequency signals transmitted through the filter circuits. The multiplexer has room for improvement in its ability to eliminate or reduce the possibility that one filter will be affected by unwanted signals from the other filter circuit when, in particular, the pass bands of these two filter circuits are far apart from each other.

SUMMARY OF THE INVENTION

Preferred embodiments of the present invention provide multiplexers in each of which two filter circuits connected to a common terminal are included to significantly reduce or prevent entry of unwanted signals from one filter circuit into the other filter circuit.

A multiplexer according to a preferred embodiment of the present invention includes a common terminal, a first input/output terminal, a second input/output terminal, a first filter circuit, a second filter circuit, and an additional circuit. Radio-frequency signals are input or output through the common terminal, the first input/output terminal, or the second input/output terminal. The first filter circuit includes a first terminal connected to the common terminal and a second terminal connected to the first input/output terminal. The first filter is a filter including a pass band that is a first frequency band. The second filter circuit includes a third terminal connected to the common terminal and a fourth terminal connected to the second input/output terminal. The second filter circuit is a filter including a pass band that is a second frequency band different from the first frequency band. The additional circuit is connected between the fourth terminal and one of the first and second terminals. The additional circuit includes a series-arm circuit and a parallel-arm circuit. The series-arm circuit is on a series-arm path providing a connection between the fourth terminal and the one of the first and second terminals. The parallel-arm circuit is on a parallel-arm path providing a connection between the series-arm path and ground. The parallel-arm circuit includes only an inductor in series with the parallel-arm path, only a capacitor in series with the parallel-arm path, or only an LC parallel-arm resonant circuit being in series with the parallel-arm path and including an inductor and a capacitor connected in parallel.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
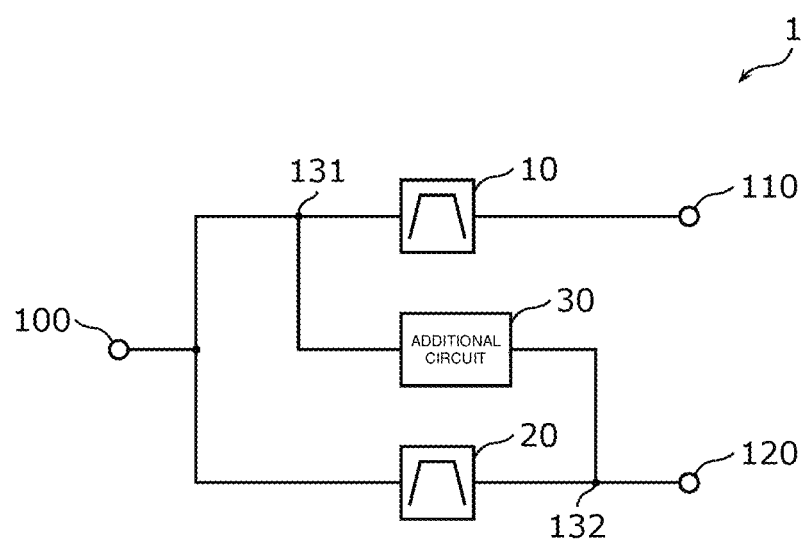
FIG. 1 illustrates circuitry of a multiplexer according to Preferred Embodiment 1 of the present invention.

Hereinafter, preferred embodiments of the present invention will be described in detail by citing examples with reference to the accompanying drawings. The following preferred embodiments are general or specific examples. Details such as values, shapes, materials, components, and arrangements and connection patterns of the components in the following preferred embodiments are provided merely as examples and should not be construed as limiting the present invention. Of the components in the following preferred embodiments, those not mentioned in an independent claim are described as optional components. The sizes and the relative proportions of the components illustrated in the drawings are not necessarily to scale.

FIG. 1 illustrates circuitry of a multiplexer 1 according to Preferred Embodiment 1. The multiplexer 1 includes a filter circuit 10, a filter circuit 20, an additional circuit 30, a common terminal 100, an input/output terminal 110, and an input/output terminal 120. The filter circuits 10 and 20 are both connected to the common terminal 100.

The common terminal 100, the input/output terminal 110 (a first input/output terminal) and the input/output terminal 120 (a second input/output terminal) are interfaces through which radio-frequency signals are input to the multiplexer 1 or output from the multiplexer 1.

The filter circuit 10 is an example of a first filter circuit and is a filter including a pass band that is the first frequency band. The filter circuit 10 includes a first terminal and a second terminal. One of the first and second terminals is connected to the common terminal 100, and the other terminal is connected to the input/output terminal 110. The one of the first and second terminals of the filter circuit 10 in the present preferred embodiment is a node 131.

The filter circuit 20 is an example of a second filter circuit and is a filter including a pass band that is a second frequency band different from the first frequency band. The filter circuit 20 includes a third terminal and a fourth terminal. The third terminal is connected to the common terminal 100, and the fourth terminal is connected to the input/output terminal 120. The fourth terminal of the filter circuit 20 in the present preferred embodiment is a node 132.

The filter circuits 10 and 20 may be acoustic wave filters using surface acoustic waves (SAWs), acoustic wave filters using bulk acoustic waves (BAWs), LC resonant filters, or dielectric filters but are not limited thereto.

The additional circuit 30 is connected between the nodes 131 and 132. Alternatively, the additional circuit 30 may be connected between a node on a path connecting the filter circuit 10 to the input/output terminal 110 and a node on a path connecting the filter circuit 20 to the common terminal 100.

The additional circuit 30 in the present preferred embodiment includes at least one series-arm circuit and at least one parallel-arm circuit. The at least one series-arm circuit is on a series-arm path providing a connection between the nodes 131 and 132. The at least one parallel-arm circuit is on a parallel-arm path providing a connection between the series-arm path and the ground. The parallel-arm circuit includes (1) only an inductor in series with the parallel-arm path, (2) only a capacitor in series with the parallel-arm path, or (3) only an LC parallel resonant circuit being in series with the parallel-arm path and including an inductor and a capacitor connected in parallel.

The wording in (1), that is, the expression "only an inductor in series with the parallel-arm path" means the omission of circuit elements, for example, inductors, capacitors, switches, and resonators, except for the inductor in series with the parallel-arm path. The parallel-arm circuit may include, for example, traces, electrodes, and terminals. The wording in (2), that is, the expression "only a capacitor in series with the parallel-arm path" means the omission of circuit elements, for example, inductors, capacitors, switches, and resonators, except for the capacitor in series with the parallel-arm path. The parallel-arm circuit may include, for example, traces, electrodes, and terminals. The wording in (3), that is, the expression "only an LC parallel resonant circuit being in series with the parallel-arm path and including an inductor and a capacitor connected in parallel" means the omission of circuit elements, for example, such as inductors, capacitors, switches, and resonators, except for the LC parallel resonant circuit in series with the parallel-arm path. The parallel-arm circuit may include, for example, traces, electrodes, and terminals.

Complex flows of unwanted signals may be present between the input/output terminals 110 and 120 of multiplexer 1, where signals may be transmitted on a route passing through the input/output terminal 110, the filter circuit 10, the common terminal 100, the filter circuit 20, and the input/output terminal 120 or signals (direct waves) may be transmitted directly between the input/output terminals 110 and 120. As the strength of unwanted signals becomes higher, the isolation characteristics of the multiplexer 1 may degraded, and the quality of radio-frequency signals transmitted through the multiplexer 1 may degraded accordingly.

Meanwhile, the circuit constant of the inductor(s) and the capacitor(s) of the additional circuit 30 of the multiplexer 1 according to the present preferred embodiment may be changed to adjust the phase and the amplitude width of signals transmitted between the nodes 131 and 132.

According to the circuitry described above, the additional circuit 30 is able to generate signals that cancel unwanted signals transmitted between the input/output terminals 110 and 120. That is, unwanted signals transmitted between the input/output terminals 110 and 120 may be attenuated by the additional circuit 30. The additional circuit 30 does not include an LC series resonant circuit on the parallel-arm path. Radio-frequency signals, which would otherwise suffer losses due to the resonance point of an LC series resonant circuit, may thus be transmitted with significantly reduced transmission loss. When the parallel-arm circuit includes an inductor and a capacitor, unwanted signals may be significantly reduced or prevented over a wide frequency band that is relatively far apart from the pass band of the filter circuit 10 or 20.

In the multiplexer 1 according to the present preferred embodiment, a radio-frequency signal in the first frequency band and a radio-frequency signal in the second frequency band may be simultaneously or substantially simultaneously transmitted through the filter circuit 10 and the filter circuit 20, respectively.

Accordingly, unwanted signals transmitted between the input/output terminals 110 and 120 may be significantly reduced or prevented by the additional circuit 30. With the filter circuits 10 and 20 being connected to the common terminal 100, entry of unwanted signals from one of the two filter circuits into the other filter circuit may be significantly reduced or prevented accordingly.

The filter circuit 10 of the multiplexer 1 according to the present preferred embodiment may be a transmitting filter that passes transmission signals from the input/output terminal 110 to the common terminal 100. The filter circuit 20 of the multiplexer 1 according to the present preferred embodiment may be a receiving filter that passes reception signals from the common terminal 100 to the input/output terminal 120. The transmitting filter and the receiving filter define a duplexer. The circuitry described above may cause unwanted signals, for example, harmonic waves of high-power transmission signals on a route passing through the input/output terminal 110 and the common terminal 100. The unwanted signals may flow into a reception path between the common terminal 100 and the input/output terminal 120, and as a result, the reception sensitivity associated with radio-frequency signals in the second frequency band may degrade. As a work around, the additional circuit 30 significantly reduces or prevents unwanted signals, for example, harmonic waves, transmitted between the input/output terminals 110 and 120. Accordingly, the possibility that the reception sensitivity in the second frequency band will degrade is able to be significantly reduced or prevented.

Figure 2A:
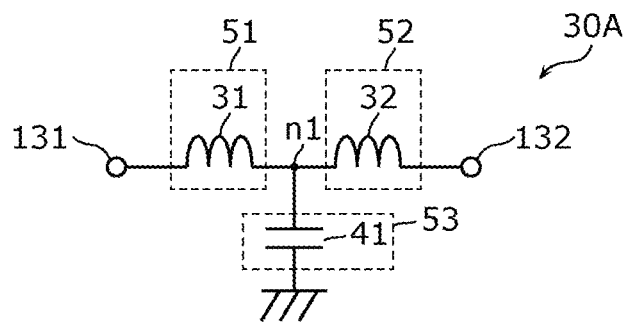
FIG. 2A illustrates, as a first example, circuitry of an additional circuit according to Preferred Embodiment 1 of the present invention.

FIG. 2A illustrates, as a first example, circuitry of an additional circuit 30A according to Preferred Embodiment 1. The additional circuit 30A in FIG. 2A is an example for describing specific circuitry of the additional circuit 30 according to Preferred Embodiment 1. The additional circuit 30A includes a series-arm circuit 51, a series-arm circuit 52, and a parallel-arm circuit 53. The series-arm circuit 51 is an example of a first series-arm circuit and is on the series-arm path providing a connection between the nodes 131 and 132. The series-arm circuit is an example of a second series-arm circuit and is on the series-arm path providing a connection between the nodes 131 and 132. The parallel-arm circuit 53 is on a parallel-arm path providing a connection between the ground and a connection node n1, at which the series-arm circuits 51 and 52 are connected to each other.

The series-arm circuit 51 includes an inductor 31, which is in series with the series-arm path. The series-arm circuit 52 includes an inductor 32, which is in series with the series-arm path. The parallel-arm circuit 53 includes only a capacitor 41, which is in series with the parallel-arm path. The additional circuit 30A in this example is a T-shaped circuitry including inductors as series-arm circuits and including a capacitor as a parallel-arm circuit.

Figure 2B:
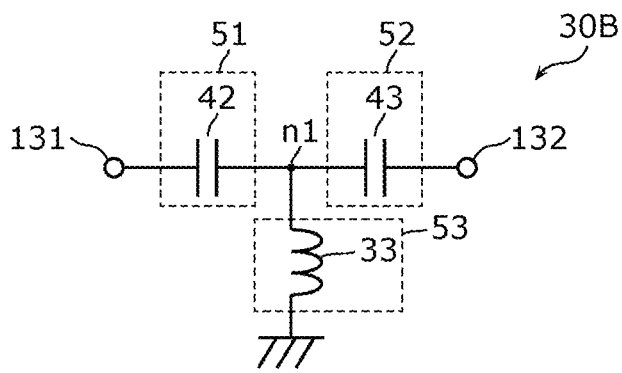
FIG. 2B illustrates, as a second example, circuitry of the additional circuit according to Preferred Embodiment 1 of the present invention.

FIG. 2B illustrates, as a second example, circuitry of an additional circuit 30B according to Preferred Embodiment 1. The additional circuit 30B in FIG. 2B is an example for describing specific circuitry of the additional circuit 30 according to Preferred Embodiment 1. The additional circuit 30B includes a series-arm circuit 51, a series-arm circuit 52, and a parallel-arm circuit 53. The series-arm circuit 51 is an example of the first series-arm circuit and is on the series-arm path providing a connection between the nodes 131 and 132. The series-arm circuit 52 is an example of the second series-arm circuit and is on the series-arm path providing a connection between the nodes 131 and 132. The parallel-arm circuit 53 is on a parallel-arm path providing a connection between the ground and a connection node n1, at which the series-arm circuits 51 and 52 are connected to each other.

The series-arm circuit 51 includes a capacitor 42, which is in series with the series-arm path. The series-arm circuit 52 includes a capacitor 43, which is in series with the series-arm path. The parallel-arm circuit 53 includes only an inductor 33, which is in series with the parallel-arm path. The additional circuit 30B in this example is a T-shaped circuitry including capacitors as series-arm circuits and including an inductor as a parallel-arm circuit.

Figure 2C:
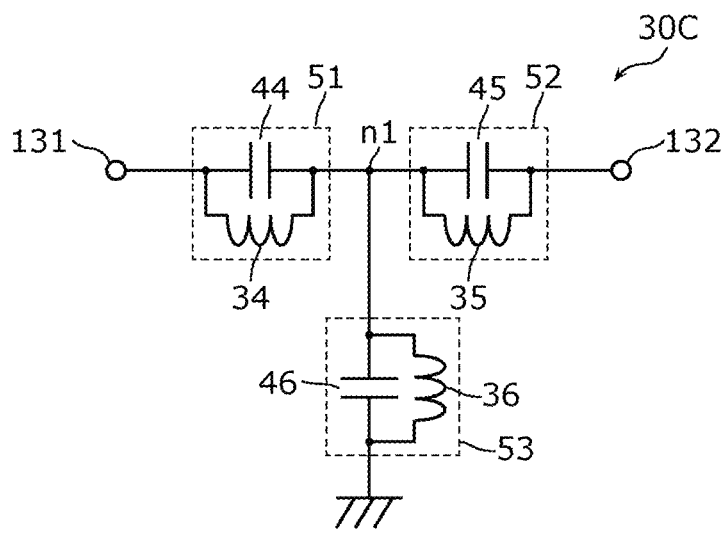
FIG. 2C illustrates, as a third example, circuitry of the additional circuit according to Preferred Embodiment 1 of the present invention.

FIG. 2C illustrates, as a third example, circuitry of an additional circuit 30C according to Preferred Embodiment 1. The additional circuit 30C in FIG. 2C is an example for describing specific circuitry of the additional circuit 30 according to Preferred Embodiment 1. The additional circuit 30C includes a series-arm circuit 51, a series-arm circuit 52, and a parallel-arm circuit 53. The series-arm circuit 51 is an example of the first series-arm circuit and is on the series-arm path providing a connection between the nodes 131 and 132. The series-arm circuit 52 is an example of the second series-arm circuit and is on the series-arm path providing a connection between the nodes 131 and 132. The parallel-arm circuit 53 is on a parallel-arm path providing a connection between the ground and a connection node n1, at which the series-arm circuits 51 and 52 are connected to each other.

The series-arm circuit 51 includes a first LC parallel resonant circuit in series with the series-arm path. The series-arm circuit 52 includes a second LC parallel resonant circuit in series with the series-arm path. The parallel-arm circuit 53 includes only a third LC parallel resonant circuit in series with the parallel-arm path. The first LC parallel resonant circuit is a circuit including a parallel connection of a capacitor 44 and an inductor 34. The second LC parallel resonant circuit is a circuit including a parallel connection of a capacitor 45 and an inductor 35. The third LC parallel resonant circuit is a circuit including a parallel connection of a capacitor 46 and an inductor 36. The additional circuit 30C in this example is a T-shaped circuitry including LC parallel resonant circuits as series-arm circuits and including another LC parallel resonant circuit as a parallel-arm circuit.

Each of the additional circuits 30A to 30C does not include an LC series resonant circuit on the parallel-arm path. Radio-frequency signals, which would otherwise suffer losses due to the resonance point of an LC series resonant circuit, may thus be transmitted with significantly reduced transmission loss. When the parallel-arm circuit 53 includes an inductor and a capacitor, unwanted signals may be significantly reduced or prevented over a wide frequency band that is relatively far apart from the pass band of the filter circuit 10 or 20.

Figure 3A:
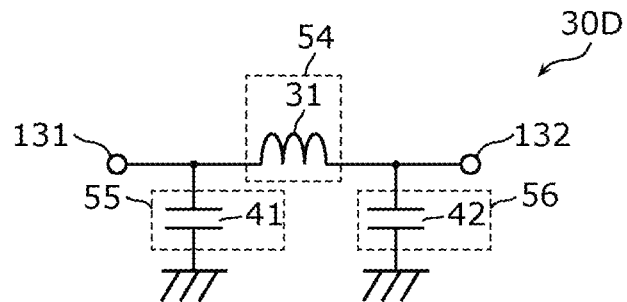
FIG. 3A illustrates, as a fourth example, circuitry of the additional circuit according to Preferred Embodiment 1 of the present invention.

FIG. 3A illustrates, as a fourth example, circuitry of an additional circuit 30D according to Preferred Embodiment 1. The additional circuit 30D in FIG. 3A is an example for describing specific circuitry of the additional circuit 30 according to Preferred Embodiment 1. The additional circuit 30D includes a series-arm circuit 54, a parallel-arm circuit 55, and a parallel-arm circuit 56. The series-arm circuit 54 is on the series-arm path providing a connection between the nodes 131 and 132. The parallel-arm circuit 55 is an example of a first parallel-arm circuit and is on a first parallel-arm path providing a connection between the node 131 and the ground. The parallel-arm circuit 56 is an example of a second parallel-arm circuit and is on a second parallel-arm path providing a connection between the node 132 and the ground.

The series-arm circuit 54 includes an inductor 31, which is in series with the series-arm path. The parallel-arm circuit 55 includes only a capacitor 41, which is in series with the first parallel-arm path. The parallel-arm circuit 56 includes only a capacitor 42, which is in series with the second parallel-arm path. The additional circuit 30D in this example is a π-shaped circuitry including an inductor as a series-arm circuit and including capacitors as parallel-arm circuits.

Figure 3B:
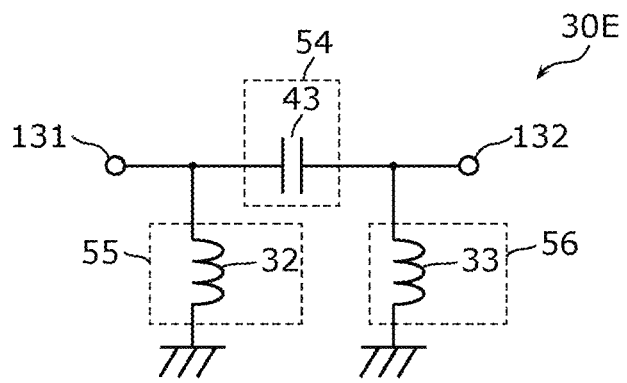
FIG. 3B illustrates, a fifth example, circuitry of the additional circuit according to Preferred Embodiment 1 of the present invention.

FIG. 3B illustrates, as a fifth example, circuitry of an additional circuit 30E according to Preferred Embodiment 1. The additional circuit 30E in FIG. 3B is an example for describing specific circuitry of the additional circuit 30 according to Preferred Embodiment 1. The additional circuit 30E includes a series-arm circuit 54, a parallel-arm circuit 55, and a parallel-arm circuit 56. The series-arm circuit 54 is on the series-arm path providing a connection between the nodes 131 and 132. The parallel-arm circuit 55 is an example of the first parallel-arm circuit and is on the first parallel-arm path providing a connection between the node 131 and the ground. The parallel-arm circuit 56 is an example of the second parallel-arm circuit and is on the second parallel-arm path providing a connection between the node 132 and the ground.

The series-arm circuit 54 includes a capacitor 43, which is in series with the series-arm path. The parallel-arm circuit 55 includes only an inductor 32, which is in series with the first parallel-arm path. The parallel-arm circuit 56 includes only an inductor 33, which is in series with the second parallel-arm path. The additional circuit 30E in this example is a n-shaped circuitry including a capacitor as a series-arm circuit and including inductors as parallel-arm circuits.

The additional circuit 30E may not include the capacitor when magnetic coupling or capacitive coupling is provided between the inductors 32 and 33.

Figure 3C:
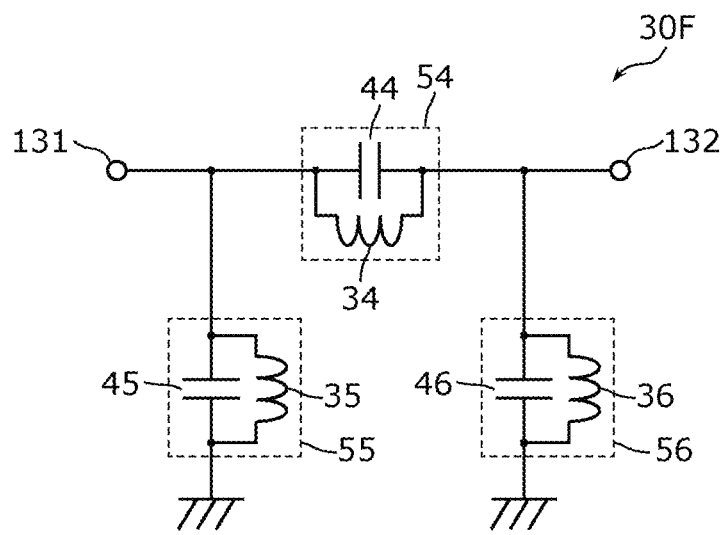
FIG. 3C illustrates, as a sixth example, circuitry of the additional circuit according to Preferred Embodiment 1 of the present invention.

FIG. 3C illustrates, as a sixth example, circuitry of an additional circuit 30F according to Preferred Embodiment 1. The additional circuit 30F in FIG. 3C is an example for describing specific circuitry of the additional circuit 30 according to Preferred Embodiment 1. The additional circuit 30F includes a series-arm circuit 54, a parallel-arm circuit 55, and a parallel-arm circuit 56. The series-arm circuit 54 is on the series-arm path providing a connection between the nodes 131 and 132. The parallel-arm circuit 55 is an example of the first parallel-arm circuit and is on the first parallel-arm path providing a connection between the node 131 and the ground. The parallel-arm circuit 56 is an example of the second parallel-arm circuit and is on the second parallel-arm path providing a connection between the node 132 and the ground.

The series-arm circuit 54 includes only a fourth LC parallel resonant circuit in series with the series-arm path. The parallel-arm circuit 55 includes only a fifth LC parallel resonant circuit in series with the first parallel-arm path. The parallel-arm circuit 56 includes only a sixth LC parallel-arm resonant circuit in series with the second parallel-arm path. The fourth LC parallel resonant circuit is a circuit including a parallel connection of a capacitor 44 and an inductor 34. The fifth LC parallel resonant circuit is a circuit including a parallel connection of a capacitor 45 and an inductor 35. The sixth LC parallel resonant circuit is a circuit including a parallel connection of a capacitor 46 and an inductor 36. The additional circuit 30F in this example is a n-shaped circuitry including an LC parallel resonant circuit as a series-arm circuit and including two other LC parallel resonant circuits as parallel-arm circuits.

Each of the additional circuits 30D to 30F does not include an LC series resonant circuit on the parallel-arm path. Radio-frequency signals, which would otherwise suffer losses due to the resonance point of an LC series resonant circuit, may thus be transmitted with significantly reduced transmission loss. When the parallel-arm circuits 55 and 56 each include an inductor and a capacitor, unwanted signals may be significantly reduced or prevented over a wide frequency band that is relatively far apart from the pass band of the filter circuit 10 or 20.

The additional circuits 30A to 30F may include, as inductors and capacitors for frequency bands at or below 5 GHz, surface-mount components in a chip, planar electrodes in a multilayer substrate, and planar coil patterns in a multilayer substrate or may include electrode wiring as inductors and capacitors for frequency bands at or above 5 GHz or for millimeter-wave bands.

The input/output terminals 110 and 120 are connected with, for example, a radio-frequency signal processing circuit (RFIC) or an amplifier circuit that amplifies radio-frequency signals. The common terminal 100 is connected to an antenna. A switching circuit may lie between the common terminal 100 and the antenna. An impedance matching inductor or an impedance matching capacitor may be provided between the common terminal and the filter circuit 10, between the common terminal 100 and the filter circuit 20, or between the antenna and the common terminal 100.

The first frequency band may be higher or lower than the second frequency band.

The filter circuit 10 may be a transmitting filter that passes transmission signals from the input/output terminal 110 to the common terminal 100. Alternatively, the filter circuit 10 may be a receiving filter that passes reception signals from the common terminal 100 to the input/output terminal 110. The filter circuit 20 may be a transmitting filter that passes transmission signals from the input/output terminal 120 to the common terminal 100. Alternatively, the filter circuit 20 may be a receiving filter that passes reception signals from the common terminal 100 to the input/output terminal 120.

Figure 4:
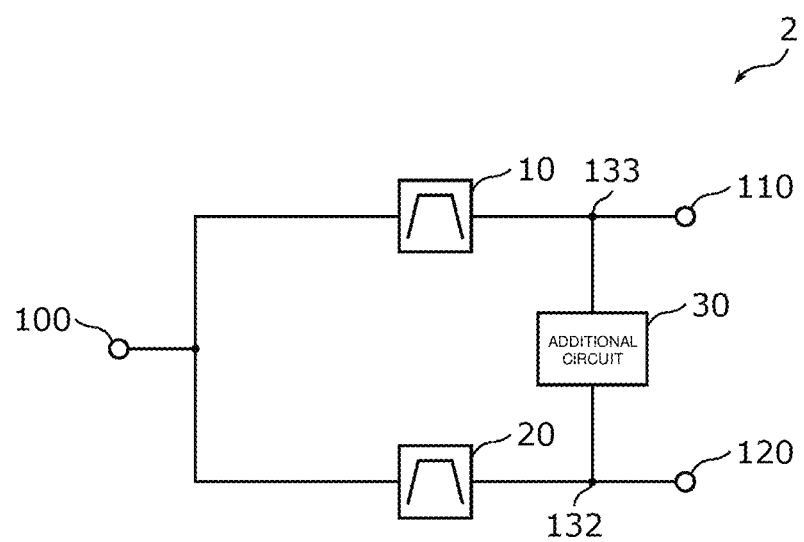
FIG. 4 illustrates circuitry of a multiplexer according to Preferred Embodiment 2 of the present invention.

FIG. 4 illustrates circuitry of a multiplexer 2 according to Preferred Embodiment 2. The multiplexer 2 includes a filter circuit 10, a filter circuit 20, an additional circuit 30, a common terminal 100, an input/output terminal 110, and an input/output terminal 120. The filter circuits 10 and 20 are both connected to the common terminal 100. The difference between the multiplexer 1 according to Preferred Embodiment 1 and the multiplexer 2 according to the present preferred embodiment is in connection points to which the additional circuit 30 is connected. Circuitry common to the multiplexer 2 according to the present preferred embodiment and the multiplexer 1 according to Preferred Embodiment 1 will be omitted from the following description, which will be provided while focusing on distinctive circuitry in the present preferred embodiment.

The filter circuit 10 is an example of a first filter circuit and is a filter including a pass band that is a first frequency band. The filter circuit 10 includes a first terminal and a second terminal. One of the first and second terminals is connected to the input/output terminal 110, and the other terminal is connected to the common terminal 100. The one of the first and second terminals of the filter circuit 10 in the present preferred embodiment is a node 133.

The filter circuit 20 is an example of a second filter circuit and is a filter including a pass band that is a second frequency band different from the first frequency band. The filter circuit 20 includes a third terminal and a fourth terminal. The third terminal is connected to the common terminal 100, and the fourth terminal is connected to the input/output terminal 120. The fourth terminal of the filter circuit 20 in the present preferred embodiment is a node 132.

The additional circuit 30 is connected between the nodes 133 and 132.

The additional circuit 30 in the present preferred embodiment includes at least one series-arm circuit and at least one parallel-arm circuit. The at least one series-arm circuit is on a series-arm path providing a connection between the nodes 133 and 132. The at least one parallel-arm circuit is on a parallel-arm path providing a connection between the series-arm path and the ground. The parallel-arm circuit includes (1) only an inductor in series with the parallel-arm path, (2) only a capacitor in series with the parallel-arm path, or (3) only an LC parallel resonant circuit being in series with the parallel-arm path and including an inductor and a capacitor connected in parallel.

According to the circuitry described above, the additional circuit 30 is able to generate signals that cancel unwanted signals transmitted between the input/output terminals 110 and 120. That is, unwanted signals transmitted between the input/output terminals 110 and 120 may be significantly reduced or prevented by the additional circuit 30. The additional circuit 30 does not include an LC series resonant circuit on the parallel-arm path. Radio-frequency signals, which would otherwise suffer losses due to the resonance point of an LC series resonant circuit, may thus be transmitted with significantly reduced transmission loss. When the parallel-arm circuit includes an inductor and/or a capacitor, unwanted signals may thus be significantly reduced or prevented over a wide frequency band that is relatively far apart from the pass band of the filter circuit 10 or 20.

Figure 5A:
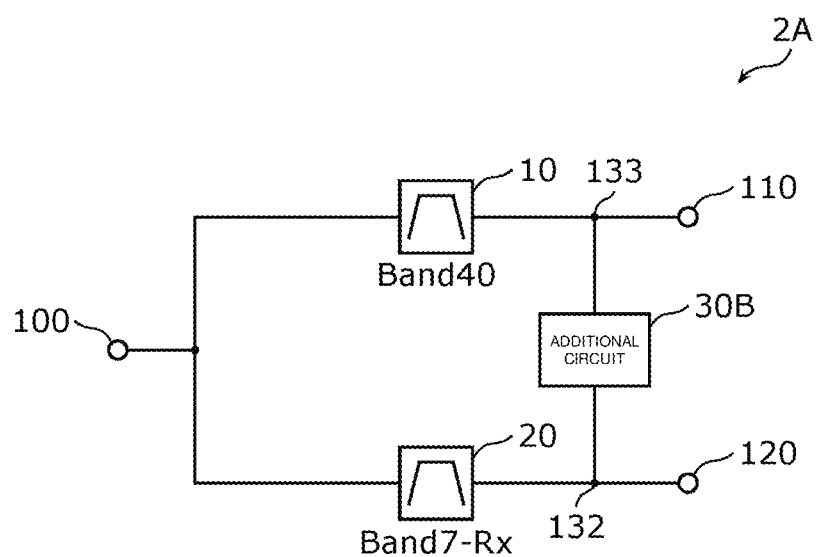
FIGS. 5A and 5B illustrate circuitry of a multiplexer according to Example 1.
Figure 5B:
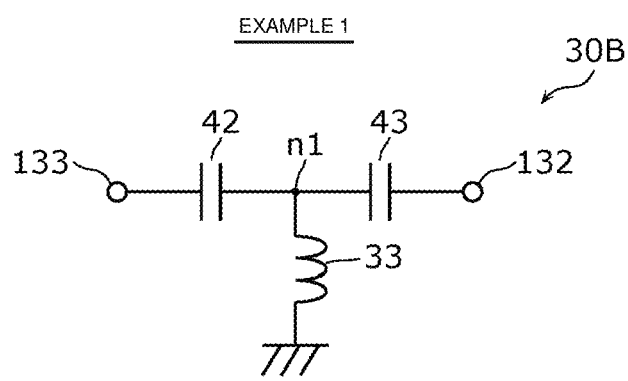

FIGS. 5A and 5B illustrate circuitry of a multiplexer 2A according to Example 1. As illustrated in FIG. 5A, the multiplexer 2A according to Example 1 includes the filter circuits 10 and 20, the additional circuit 30B, the common terminal 100, and the input/output terminals 110 and 120. The multiplexer 2A according to Example 1 is based on the multiplexer 2 according to Preferred Embodiment 2. The pass band of the filter circuit 10 is long term evolution (LTE) Band 40 (2,300 to 2,400 MHz), and the pass band of the filter circuit 20 is the reception band of LTE Band 7 (2,620 to 2,690 MHz). As illustrated FIG. 5B, the additional circuit of the multiplexer 2A is the additional circuit 30B. As in the preferred embodiment above, the additional circuit 30B includes the capacitors 42 and 43 and the inductor 33. The capacitors 42 and 43 are in series with a series-arm path providing a connection between a node 133 and a node 132, and the inductor 33 is in series with a parallel-arm path providing a connection between a connection node n1 and the ground.

Figure 6:
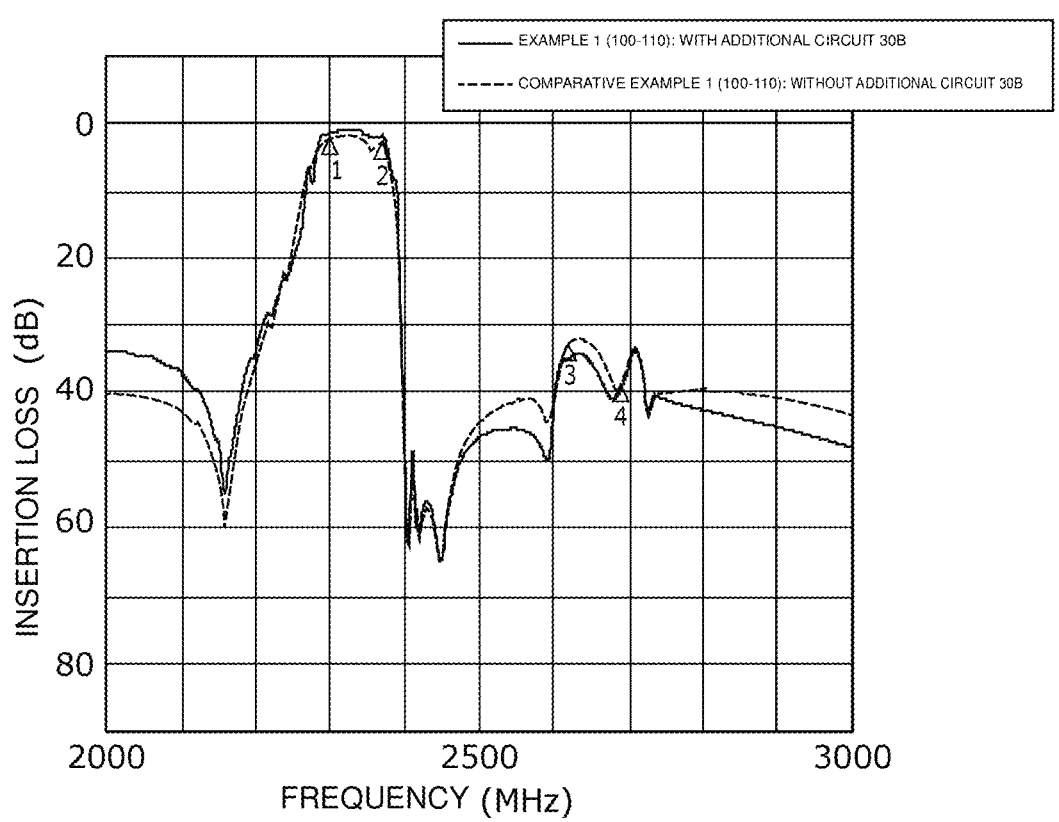
FIG. 6 is a graph that provides a comparison of bandpass characteristics of a first filter circuit according to Example 1 and bandpass characteristics of a first filter circuit according to Comparative Example 1.

FIG. 6 is a graph that provides a comparison of bandpass characteristics of the multiplexer according to Example 1 and bandpass characteristics of a multiplexer according to Comparative Example 1. Unlike the multiplexer 2A according to Example 1, the multiplexer according to Comparative Example 1 does not include the additional circuit 30B. FIG. 6 illustrates bandpass characteristics of the filter circuit 10 according to Example 1 and bandpass characteristics of the filter circuit 10 according to Comparative Example 1. The comparison provided in FIG. 6 has revealed that the filter circuit 10 of the multiplexer 2A according to Example 1 provides a significant improvement over the filter circuit 10 of the multiplexer according to Comparative Example 1, or more specifically, provides low-loss transmission in the pass band of the filter circuit 10 (Band 40) and increases the attenuation of signals in the attenuation band corresponding to the pass band of the filter circuit 20 (the reception band of Band 7). The additional circuit 30B of the multiplexer 2A according to Example 1 provides this significant improvement by significantly reducing unwanted signals lying in the pass band of the filter circuit 20 and transmitted between the input/output terminal 110 and the common terminal 100.

In this example, the frequency spacing between the pass band of the filter circuit 10 and the pass band of the filter circuit 20 is greater than one of the bandwidths of the filter circuits 10 and 20 that is smaller than the other; that is, a frequency spacing of 220 MHz between the Band 40 (2,300 to 2,400 MHz) and Band 7 Rx (2,620 to 2,690 MHz) is greater than the bandwidth (70 MHz) of the filter circuit 20, which is smaller than the bandwidth (100 MHz) of the pass band of the filter circuit 10.

A case where the frequency spacing between the pass bands of the two filter circuits is greater than the band width of at least one of the filter circuits may be addressed by the parallel-arm circuit of the additional circuit including an inductor, for example. According to this circuitry, which is not an acoustic wave resonator, unwanted signals may be significantly reduced or prevented over a wide frequency band that is relatively far apart from the pass band of the filter circuit 10 or 20.

The following describes the relationship between the circuitry of the parallel-arm circuit of the additional circuit 30 and the filter bandpass characteristics.

Figure 7A:
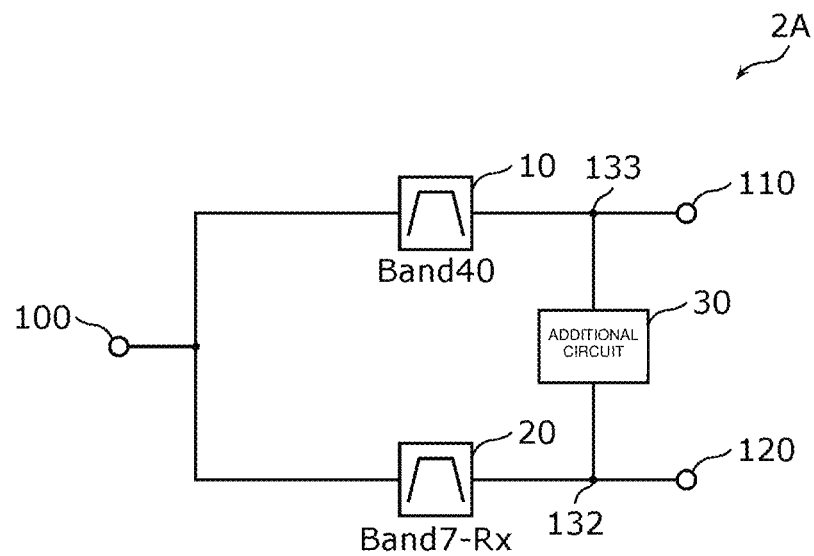
FIGS. 7A to 7C illustrate circuitry of the multiplexer according to Example 1 and circuitry of a multiplexer according to Comparative Example 2.
Figure 7B:
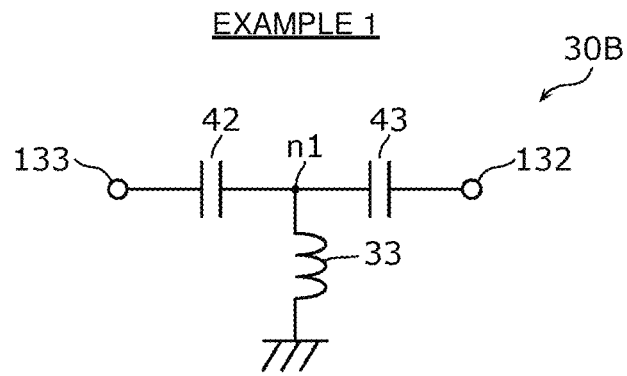
Figure 7C:
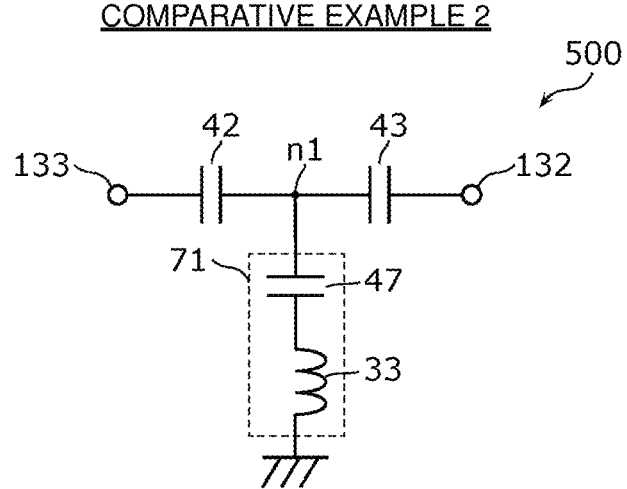

FIGS. 7A to 7C illustrate circuitry of the multiplexer according to Example 1 and circuitry of a multiplexer according to Comparative Example 2. FIG. 7A illustrates circuitry of the multiplexer 2A according to Example 1. FIG. 7B illustrates circuitry of the additional circuit 30B according to Example 1. FIG. 7C illustrates circuitry of an additional circuit 500 according to Comparative Example 2.

The multiplexer according to Comparative Example 2 is provided by replacing the additional circuit 30 of the multiplexer 2A according to Example 1 with the additional circuit 500 illustrated in FIG. 7C. As illustrated in FIG. 7C, the additional circuit 500 of the multiplexer according to Comparative Example 2 includes a capacitor 42, a capacitor 43, and an LC series resonant circuit 71. The capacitors 42 and 43 are in series with the series-arm path providing a connection between the nodes 133 and 132. The LC series resonant circuit 71 is in series with the parallel-arm path providing a connection between the connection node n1 and the ground. The LC series resonant circuit 71 includes a capacitor 47 and an inductor 33, which are connected in series.

Figure 8:
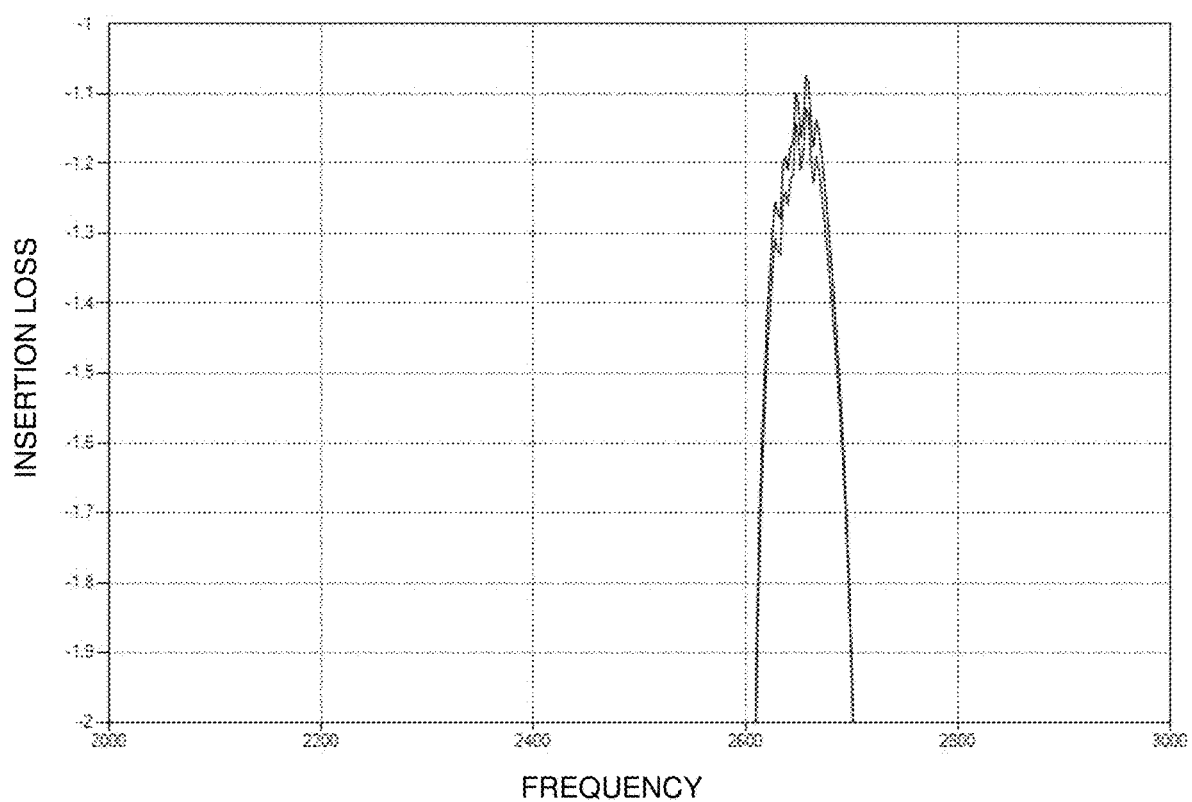
FIG. 8 is a graph that provides a comparison of bandpass characteristics of a second filter circuit according to Example 1 and bandpass characteristics of a second filter circuit according to Comparative Example 2.

FIG. 8 is a graph that provides a comparison of bandpass characteristics of the filter circuit 20 according to Example 1 and bandpass characteristics of the filter circuit 20 according to Comparative Example 2. As illustrated in FIG. 8, the insertion loss in the filter circuit 20 according to Example 1 is smaller than the insertion loss in the filter circuit 20 according to Comparative Example 2.

As illustrated in FIGS. 5 and 6, the additional circuit 30B of the multiplexer 2A according to Example 1 significantly reduces or prevents unwanted signals lying in the pass band of the filter circuit 20 and transmitted between the input/output terminal 110 and the common terminal 100. More specifically, the additional circuit 30B generates signals that are substantially in antiphase to unwanted signals lying in the pass band of the filter circuit 20 and transmitted between the input/output terminal 110 and the common terminal 100, and the generated signals in turn cancel the unwanted signals. Similarly, the additional circuit 500 of the multiplexer according to Comparative Example 2 generates signals that are substantially in antiphase to unwanted signals lying in the pass band of the filter circuit 20 and transmitted between the input/output terminal 110 and the common terminal 100, and the generated signals in turn cancel the unwanted signals. However, the multiplexer according to Comparative Example 2 has the following drawback: radio-frequency signals in or nearby the resonant frequency of the LC series resonant circuit 71 included as a parallel-arm circuit flow into the ground through the LC series resonant circuit 71, and this may conceivably induces some of the radio-frequency signals in the pass band of the filter circuit 20 to flow into the parallel-arm path.

The additional circuit 30B of the multiplexer 2A according to Example 1 does not include an LC series resonant circuit on the parallel-arm path. Radio-frequency signals, which would otherwise suffer losses due to the resonance point of an LC series resonant circuit, may thus be transmitted with significantly reduced transmission loss. When the parallel-arm circuit includes an inductor, unwanted signals may be significantly reduced or prevented over a wide frequency band that is relatively far apart from the pass band of the filter circuit 10 or 20.

The following describes how unwanted signals may be significantly reduced or prevented by the action of the additional circuit 30.

Figure 9A:
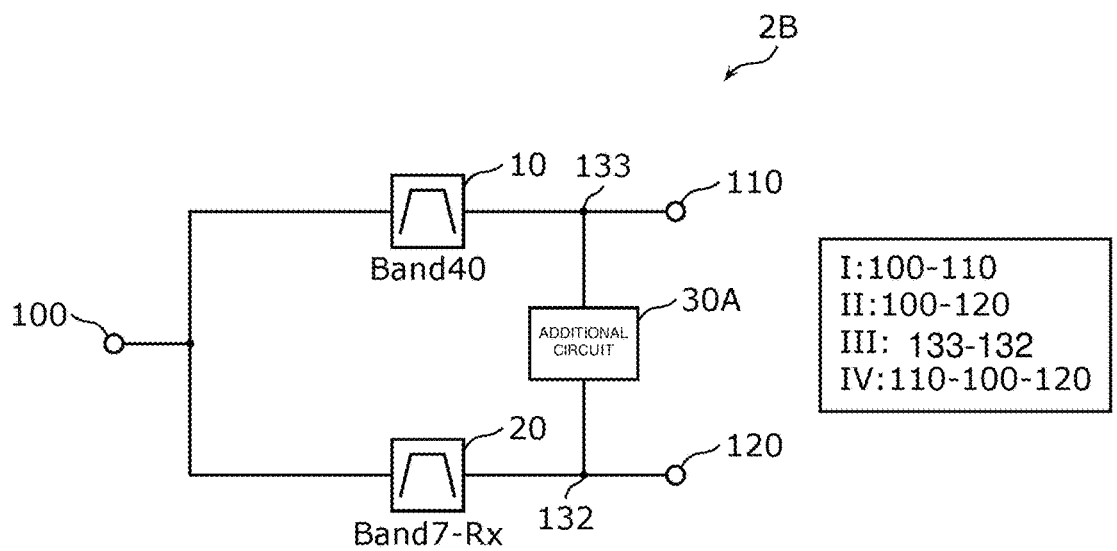
FIGS. 9A and 9B illustrate circuitry of a multiplexer according to Example 2.
Figure 9B:
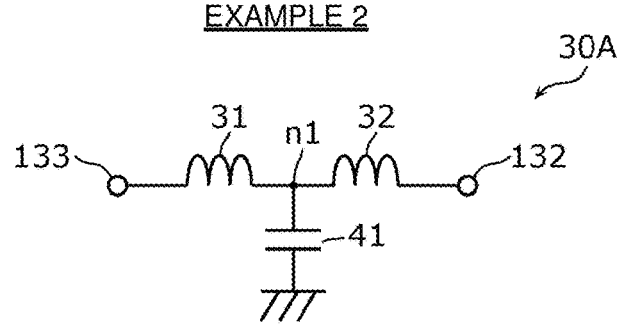

FIGS. 9A and 9B illustrates circuitry of a multiplexer 2B according to Example 2. FIG. 9A illustrates circuitry of the multiplexer 2B according to Example 2. FIG. 9B illustrates circuitry of the additional circuit 30A according to Example 2.

The multiplexer 2B according to Example 2 is provided by replacing the additional circuit 30B of the multiplexer 2A according to Example 1 with the additional circuit 30A illustrated in FIG. 2A. As illustrated in FIG. 9B, the additional circuit 30A of the multiplexer 2B according to Example 2 includes the inductors 31 and 32 and the capacitor 41. The inductors 31 and 32 are in series with the series-arm path providing a connection between the nodes 133 and 132. The capacitor 41 is in series with the parallel-arm path providing a connection between the connection node n1 and the ground.

Figure 10A:
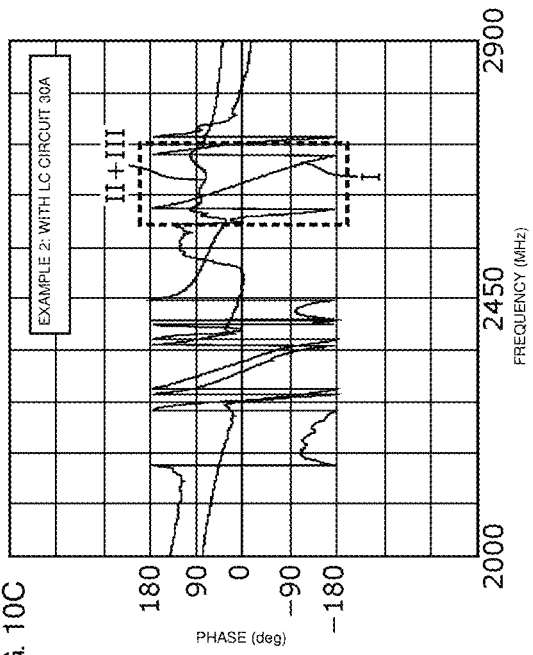
FIGS. 10A to 10D include graphs that provide comparisons of bandpass characteristics, isolation characteristics, and phase characteristics of the multiplexer according to Example 2 and those of a multiplexer according to Comparative Example 1.

FIGS. 10A to 10D include graphs that provide comparisons of bandpass characteristics, isolation characteristics, and phase characteristics of the multiplexer according to Example 2 and those of the multiplexer according to Comparative Example 1. FIG. 10A illustrates bandpass characteristics of (the filter circuits 10 and 20 of) the multiplexer according to Example 2 and those of the multiplexer according to Comparative Example 1. With regard to the bandpass characteristics of the filter circuit 10 (see I in FIG. 10A), the amount of attenuation in the attenuation band corresponding to the pass band of the filter circuit 20 is greater in Example 2 than in Comparative Example 1.

Figure 10C:
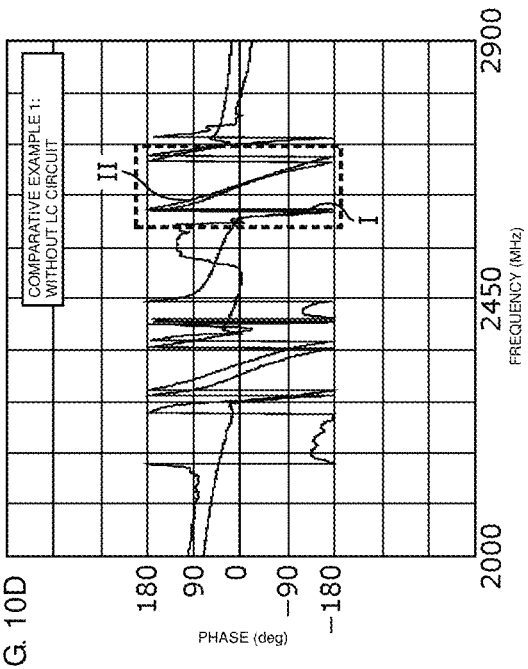
Figure 10B:
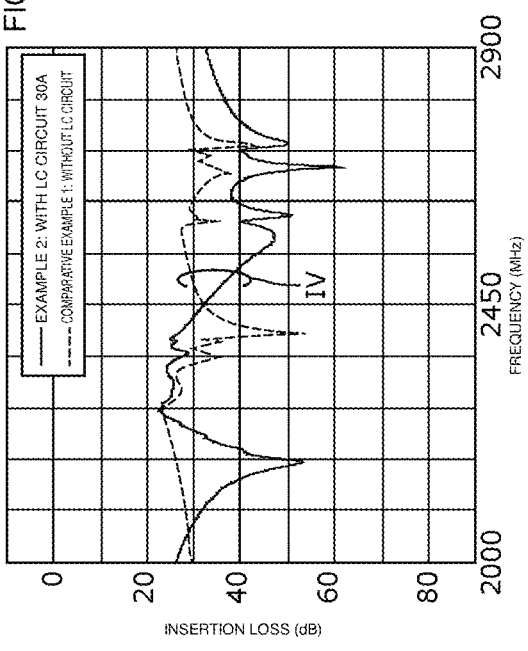

FIG. 10B illustrates the isolation characteristics (on a route passing through the input/output terminal 110, the common terminal 100, and the input/output terminal 120) of the multiplexer according to Example 2 and those of the multiplexer according to Comparative Example 1. With regard to the isolation characteristics (see IV in FIG. 10B), the insertion loss in the pass band of the filter circuit 20 is greater in Example 2 than in Comparative Example 1. That is, the multiplexer according to Example 2 has significantly improved isolation characteristics.

Figure 10D:
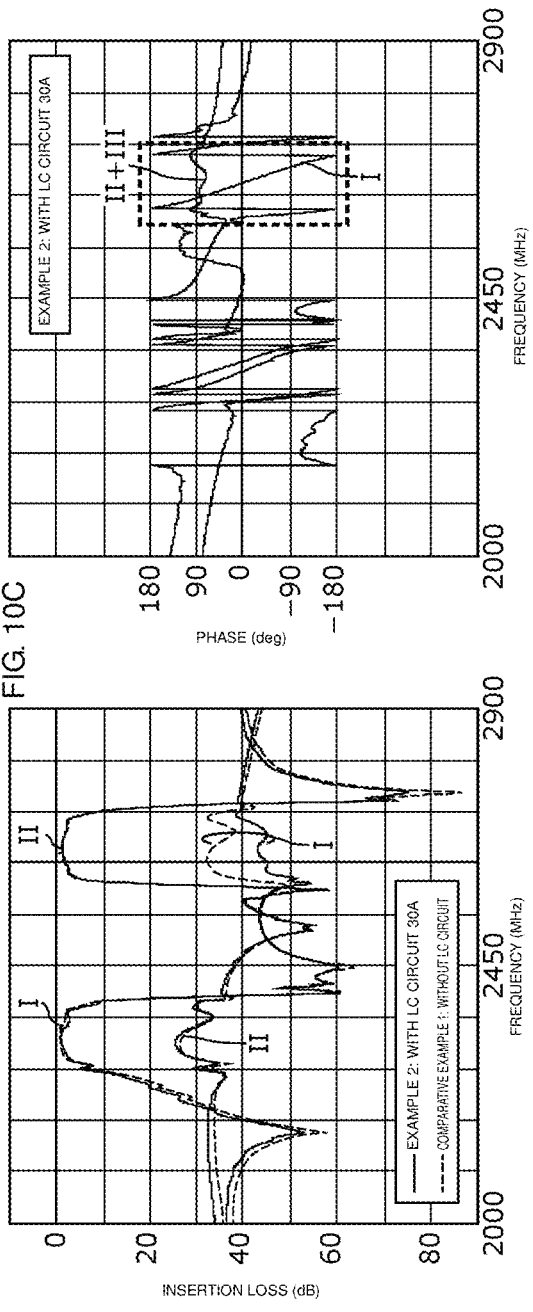

FIG. 10D illustrates the phase characteristics of (the filter circuits 10 and 20 of) the multiplexer according to Comparative Example 1. A comparison of the phase characteristics of the filter circuit 10 (see I in FIG. 10D) and the phase characteristics of the filter circuit 20 (see II in FIG. 10D) has revealed that the phase of the filter circuit 10 and the phase of the filter circuit 20 coincide with each other in the pass band of the filter circuit 20. This may be the reason why the isolation characteristics in Comparative Example 1 degrade as illustrated in FIG. 10B.

FIG. 10C illustrates the phase characteristics of (the filter circuits 10 and 20 and the additional circuit 30A of) the multiplexer 2B according to Example 2. A comparison of the phase characteristics of the filter circuit 10 (see I in FIG. 10C) and the phase characteristics of the filter circuit 20 and the additional circuit 30A (see II+III in FIG. 10C) has revealed that the phase of the filter circuit 10 and the phase of the filter circuit 20 and the additional circuit 30A do not coincide with each other in the pass band of the filter circuit 20. Accordingly, Example 2 provides significantly improved isolation characteristics as illustrated in FIG. 10B.

The additional circuit 30A of the multiplexer 2B according to Example 2 generates signals that are out of phase with unwanted signals as mentioned above. Consequently, unwanted signals transmitted between the input/output terminals 110 and 120 may be canceled by the signals generated by the additional circuit 30A. That is, unwanted signals transmitted between the input/output terminals 110 and 120 may be attenuated by the additional circuit 30A. The additional circuit 30A does not include an LC series resonant circuit on the parallel-arm path. Radio-frequency signals, which would otherwise suffer losses due to the resonance point of an LC series resonant circuit, may thus be transmitted with significantly reduced transmission loss. When the parallel-arm circuit includes an inductor, unwanted signals may be significantly reduced or prevented over a wide frequency band that is relatively far apart from the pass band of the filter circuit 10 or 20.

The following describes mounting of the multiplexer 2B according to Example 2. The filter circuits 10 and 20 and the additional circuit 30A of the multiplexer 2B may, for example, be surface-mounted on a mounting substrate.

Examples of the mounting substrate include: a low-temperature co-fired ceramic (LTCC) substrate or a high-temperature co-fired ceramic (HTCC) substrate including a plurality of dielectric layers stacked on one another; a substrate with embedded components; a substrate provided with a redistribution layer (RDL); and a printed circuit board. The common terminal 100 and the input/output terminals 110 and 120 may be provided on the mounting substrate.

The surface of the mounting substrate, the filter circuits 10 and 20, and the additional circuit 30A may be overlaid with resin.

The filter circuits 10 and 20 are, for example, surface-mount components. The filter circuits 10 and 20 may be acoustic wave filters using surface acoustic waves (SAWs), acoustic wave filters using bulk acoustic waves (BAWs), LC resonant filters, or dielectric filters but are not limited thereto.

The inductors 31 and 32 and the capacitor 41 of the additional circuit 30A are, for example, surface-mount components in a chip. The direction of the magnetic flux of the inductor 31 preferably coincides with the direction of the magnetic flux of the inductor 32, for example. Accordingly, the mutual inductance between the inductors 31 and 32 may be used by the additional circuitry 30A, and thus the inductors 31 and 32 may be small in size. Alternatively, the additional circuit 30A may be a dielectric filter that equivalently implements the circuitry of each of the inductors 31 and 32 and the capacitor 41.

In a case where the mounting substrate is a multilayer substrate, the inductors 31 and 32 may be planar coil patterns in the multilayer substrate, and the capacitor 41 may be a planar electrode pattern in the multilayer substrate.

The following describes a multiplexer including three or more filter circuits connected to a common terminal.

Figure 11A:
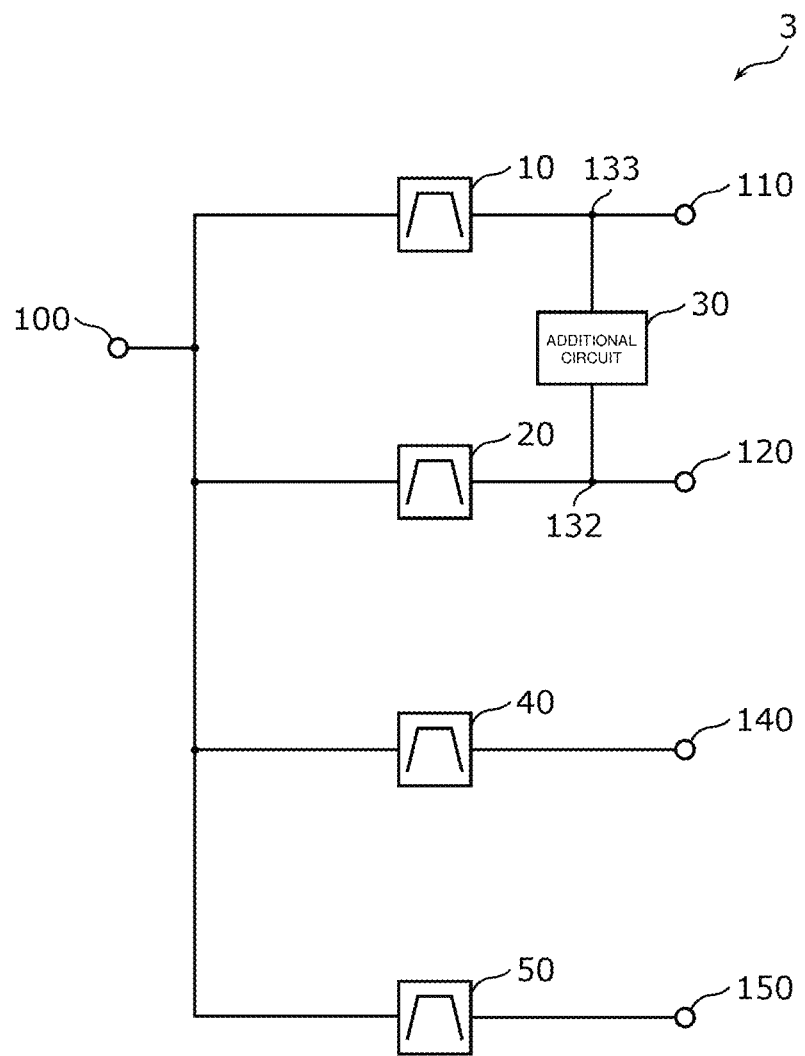
FIG. 11A illustrates circuitry of a multiplexer according to Preferred Embodiment 3 of the present invention.

FIG. 11A illustrates circuitry of a multiplexer 3 according to Preferred Embodiment 3. The multiplexer 3 includes a filter circuit 10, a filter circuit 20, a filter circuit 40, a filter circuit 50, an additional circuit 30, a common terminal 100, an input/output terminal 110, an input/output terminal 120, an input/output terminal 140, and an input/output terminal 150. The filter circuits 10, 20, 40, and 50 are all connected to the common terminal 100. The multiplexer 3 according to the present preferred embodiment differs from the multiplexer 2 according to Preferred Embodiment 2 in that the multiplexer 3 includes the filter circuits 40 and 50. Circuitry common to the multiplexer 3 according to the present preferred embodiment and the multiplexer 2 according to Preferred Embodiment 2 will be omitted from the following description, which will be provided while focusing on distinctive circuitry in the present preferred embodiment.

The filter circuit 40 is a filter including a pass band that is a third frequency band different from first and second frequency bands. The filter circuit 40 includes a terminal connected to the common terminal 100 and a terminal connected to the input/output terminal 140.

The filter circuit 50 is a filter including a pass band that is a fourth frequency band different from the first to third frequency bands. The filter circuit 50 includes a terminal connected to the common terminal 100 and a terminal connected to the input/output terminal 150.

According to the circuitry described above, the additional circuit 30 is able to generate signals that cancel unwanted signals transmitted between the input/output terminals 110 and 120. That is, unwanted signals transmitted between the input/output terminals 110 and 120 may be significantly reduced or prevented by the additional circuit 30. The additional circuit 30 does not include an LC series resonant circuit on the parallel-arm path. Radio-frequency signals, which would otherwise suffer losses due to the resonance point of an LC series resonant circuit, may thus be transmitted with significantly reduced transmission loss. When the parallel-arm circuit includes an inductor and/or a capacitor, unwanted signals may be significantly reduced or prevented over a wide frequency band that is relatively far apart from the pass band of the filter circuit 10 or 20.

The multiplexer 3 according to the present preferred embodiment preferably includes at least three filter circuits connected to the common terminal 100, for example. The additional circuit 30 may be connected between the input/output terminal 120 and a node on a path connecting the common terminal 100 to the filter circuit 10 or may be connected between the input/output terminal 110 and a node on a path connecting the common terminal 100 to the filter circuit 20.

Figure 11B:
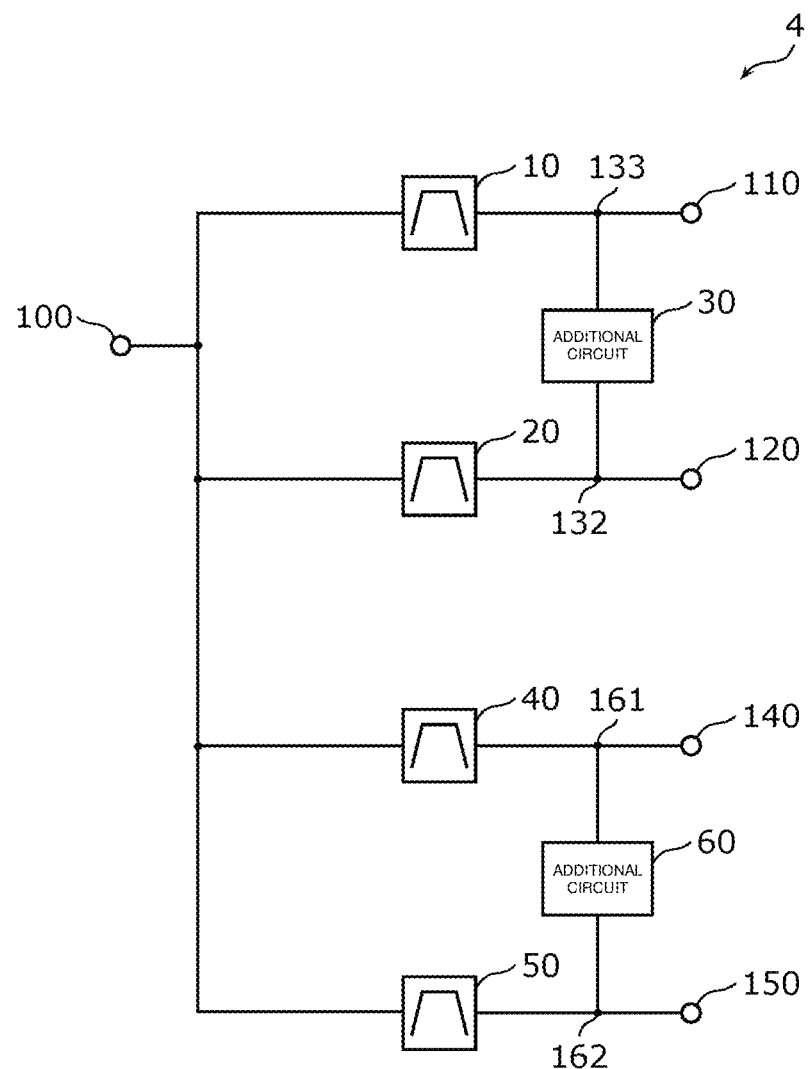
FIG. 11B illustrates circuitry of a multiplexer according to a modification of Preferred Embodiment 3 of the present invention.

FIG. 11B illustrates circuitry of a multiplexer 4 according to a modification of Preferred Embodiment 3. The multiplexer 4 includes the filter circuits 10, 20, 40, and 50, the additional circuit 30, an additional circuit 60, the common terminal 100, and the input/output terminals 110, 120, 140, and 150. The filter circuits 10, 20, 40, and 50 are all connected to the common terminal 100. The multiplexer 4 according to this modification differs from the multiplexer 3 according to Preferred Embodiment 3 in that the multiplexer 4 includes the additional circuit 60. Circuitry common to the multiplexer 4 according to this modification and the multiplexer 3 according to Preferred Embodiment 3 will be omitted from the following description, which will be provided while focusing on distinctive circuitry in the present preferred embodiment.

The additional circuit 60 is connected between a node 161 and a node 162. The node 161 is located on a path connecting the filter circuit 40 to the input/output terminal 140. The node 162 is located on a path connecting the filter circuit 50 to the input/output terminal 150. Alternatively, the additional circuit 60 may be connected between the node 162 and a node on a path connecting the common terminal 100 to the filter circuit 40 or may be connected between the node 161 and a node on a path connecting the common terminal 100 to the filter circuit 50.

The additional circuit 60 in this modification includes at least one series-arm circuit and at least one parallel-arm circuit. The at least one series-arm circuit is on a series-arm path providing a connection between the nodes 161 and 162. The at least one parallel-arm circuit is on a parallel-arm path providing a connection between the series-arm path and the ground. The parallel-arm circuit includes (1) only an inductor in series with the parallel-arm path, (2) only a capacitor in series with the parallel-arm path, or (3) only an LC parallel resonant circuit being in series with the parallel-arm path and including an inductor and a capacitor connected in parallel. Examples of the specific circuitry of the additional circuit 60 are identical or similar to the additional circuits 30A to 30F respectively illustrated in FIGS. 2A to 2C and FIGS. 3A to 3C.

According to the circuitry described above, the additional circuit 30 is able to generate signals that cancel unwanted signals transmitted between the input/output terminals 110 and 120. That is, unwanted signals transmitted between the input/output terminals 110 and 120 may be significantly reduced or prevented by the additional circuit 30. According to the circuitry described above, the additional circuit 60 is able to generate signals that cancel unwanted signals transmitted between the input/output terminals 140 and 150. That is, unwanted signals transmitted between the input/output terminals 140 and 150 may be significantly reduced or prevented by the additional circuit 60. Each of the additional circuits 30 and 60 does not include an LC series resonant circuit on the parallel-arm path. Radio-frequency signals, which would otherwise suffer losses due to the resonance point of an LC series resonant circuit, may thus be transmitted with significantly reduced transmission loss. When at least one of the parallel-arm circuit of the additional circuit 30 and the parallel-arm circuit of the additional circuit 60 includes an inductor and/or a capacitor, unwanted signals may be significantly reduced or prevented over a wide frequency band that is relatively far apart from the pass band of the filter circuit 10, 20, 40, or 50.

The multiplexer 4 according to this modification may include three or more additional circuits. That is, each of the additional circuits may be connected between any two of the input/output terminals 110, 120, 140, and 150.

The multiplexer 1 according to Preferred Embodiment 1 includes the common terminal 100, the input/output terminals 110 and 120, the filter circuits 10 and 20, and the additional circuit 30. Radio-frequency signals are input or output through the common terminal 100, the input/output terminal 110, or the input/output terminal 120. The filter circuit 10 includes the first terminal connected to the common terminal 100 and the second terminal connected to the input/output terminal 110. The filter circuit 10 is a filter including a pass band that is the first frequency band. The filter circuit 20 includes the third terminal connected to the common terminal 100 and the fourth terminal connected to the input/output terminal 120. The filter circuit 20 is a filter including a pass band that is the second frequency band different from the first frequency band. The additional circuit 30 is connected between the fourth terminal and one of the first and second terminals. The additional circuit 30 includes at least one series-arm circuit and at least one parallel-arm circuit. The at least one series-arm circuit is on a series-arm path providing a connection between the fourth terminal and one of the first and the second terminals. The at least one parallel-arm circuit is on a parallel-arm path providing a connection between the series-arm circuit and ground. The at least one parallel-arm circuit includes (1) only an inductor in series with the parallel-arm path, (2) only a capacitor in series with the parallel-arm path, or (3) only an LC parallel resonant circuit being in series with the parallel-arm path and including an inductor and a capacitor connected in parallel.

The circuit constant of the inductor(s) and the capacitor(s) of the additional circuit 30 may be changed to adjust the phase and the amplitude width of signals passing through the additional circuit 30. According to the circuitry described above, the additional circuit 30 is able to generate signals that cancel unwanted signals transmitted between the input/output terminals 110 and 120. That is, unwanted signals transmitted between the input/output terminals 110 and 120 may be attenuated by the additional circuit 30. The additional circuit 30 does not include an LC series resonant circuit on the parallel-arm path. Radio-frequency signals, which would otherwise suffer losses due to the resonance point of an LC series resonant circuit, may thus be transmitted with significantly reduced transmission loss. When the at least one parallel-arm circuit includes an inductor and/or a capacitor, unwanted signals may be significantly reduced or prevented over a wide frequency band that is relatively far apart from the pass band of the filter circuit 10 or 20.

The additional circuit 30A may be provided as follows. The additional circuit 30A includes the series-arm circuits 51 and 52 and the parallel-arm circuit 53. The series-arm circuits 51 and 52 are on the series-arm path. The parallel-arm circuit 53 is on the parallel-arm circuit providing a connection between the ground and the connection node n1 at which the series-arm circuits 51 and 52 are connected to each other. The series-arm circuits 51 and 52 include the inductors 31 and 32, respectively. The inductors 31 and 32 are in series with the series-arm path. The parallel-arm circuit 53 includes only the capacitor 41 in series with the parallel-arm path.

The additional circuit 30B may be provided as follows. The additional circuit 30B includes the series-arm circuits 51 and 52 and the parallel-arm circuit 53. The series-arm circuits 51 and 52 are on the series-arm path. The parallel-arm circuit 53 is on the parallel-arm circuit providing a connection between the ground and the connection node n1 at which the series-arm circuits 51 and 52 are connected to each other. The series-arm circuits 51 and 52 include the capacitors 42 and 43, respectively. The capacitors 42 and 43 are in series with the series-arm path. The parallel-arm circuit 53 includes only the inductor 33 in series with the parallel-arm path.

The additional circuit 30C may be provided as follows. The additional circuit 30C includes the series-arm circuits 51 and 52 and the parallel-arm circuit 53. The series-arm circuits 51 and 52 are on the series-arm path. The parallel-arm circuit 53 is on the parallel-arm circuit providing a connection between the ground and the connection node n1 at which the series-arm circuits 51 and 52 are connected to each other. The series-arm circuits 51 and 52 each include an LC parallel resonant circuit being in series with the series-arm path and including an inductor and a capacitor connected in parallel. The parallel-arm circuit 53 includes only an LC parallel resonant circuit being in series with the parallel-arm path and including the inductor 36 and the capacitor 46 connected in parallel.

Each of the additional circuits 30A to 30C does not include an LC series resonant circuit on the parallel-arm path. Radio-frequency signals, which would otherwise suffer losses due to the resonance point of an LC series resonant circuit, may thus be transmitted with significantly reduced transmission loss. When the parallel-arm circuit 53 includes an inductor and a capacitor, unwanted signals may be significantly reduced or prevented over a wide frequency band that is relatively far apart from the pass band of the filter circuit 10 or 20.

The additional circuit 30D may be provided as follows. The additional circuit 30D includes the series-arm circuit 54 and the parallel-arm circuits 55 and 56. The series-arm circuit 54 is in series with the series-arm path. The parallel-arm circuit 55 is on the parallel-arm path providing a connection between the ground and one of the first and second terminals. The parallel-arm circuit 56 is on the parallel-arm path providing a connection between the fourth terminal and the ground. The series-arm circuit 54 includes the inductor 31 in series with the series-arm path. The parallel-arm circuit 55 includes only the capacitor 41 in series with the first parallel-arm path. The parallel-arm circuit includes only the capacitor 42 in series with the second parallel-arm path.

The additional circuit 30E may be provided as follows. The additional circuit 30E includes the series-arm circuit 54 and the parallel-arm circuits 55 and 56. The series-arm circuit 54 is in series with the series-arm path. The parallel-arm circuit 55 is on the parallel-arm path providing a connection between the ground and one of the first and second terminals. The parallel-arm circuit 56 is on the second series-arm path providing a connection between the fourth terminal and the ground. The series-arm circuit 54 includes the capacitor 43 in series with the series-arm path. The parallel-arm circuit 55 includes only the inductor 32 in series with the first parallel-arm path. The parallel-arm circuit 56 includes only the inductor 33 in series with the second parallel-arm path.

The additional circuit 30F may be provided as follows. The additional circuit 30F includes the series-arm circuit 54 and the parallel-arm circuits 55 and 56. The series-arm circuit 54 is in series with the series-arm path. The parallel-arm circuit 55 is on the parallel-arm path providing a connection between the ground and one of the first and second terminals. The parallel-arm circuit 56 is on the second parallel-arm path providing a connection between the ground and the fourth terminal. The series-arm circuit 54 includes an LC parallel resonant circuit being in series with the series-arm path and including the inductor 34 and the capacitor 44 connected in parallel. The parallel-arm circuit includes only an LC parallel-arm resonant circuit being in series with the first parallel-arm path and including the inductor 35 and the capacitor 45 connected in parallel. The parallel-arm circuit 56 includes only an LC parallel resonant circuit being in series with the second parallel-arm path and including the inductor 36 and the capacitor 46 connected in parallel.

Each of the additional circuits 30D to 30F does not include an LC series resonant circuit on the parallel-arm path. Radio-frequency signals, which would otherwise suffer losses due to the resonance point of an LC series resonant circuit, may thus be transmitted with significantly reduced transmission loss. When the parallel-arm circuits 55 and 56 each include an inductor and a capacitor, unwanted signals may be significantly reduced or prevented over a wide frequency band that is relatively far apart from the pass band of the filter circuit 10 or 20.

In the multiplexer 1, a radio-frequency signal in the first frequency band and a radio-frequency signal in the second frequency band may be simultaneously or substantially simultaneously transmitted through the filter circuit 10 and the filter circuit 20, respectively.

Accordingly, unwanted signals transmitted between the input/output terminals 110 and 120 may be significantly reduced or prevented by the additional circuit 30. With the filter circuits 10 and 20 being connected to the common terminal 100, entry of unwanted signals from one of the two filter circuits into the other filter circuit may be significantly reduced or prevented accordingly.

The frequency spacing between the first and second frequency bands may be greater than one of the bandwidths of the first and second frequency bands that is smaller than the other.

A case where the frequency spacing between the pass bands of the filter circuits 10 and 20 is greater than the band width of at least one of the filter circuits 10 and 20 may be addressed by the parallel-arm circuit of the additional circuit including an inductor and/or a capacitor, without an acoustic wave resonator, for example. Accordingly, unwanted signals may be significantly reduced or prevented over a wide frequency band that is relatively far apart from the pass band of the filter circuit 10 or 20.

The filter circuit 10 may be a transmitting filter that passes transmission signals from the input/output terminal 110 to the common terminal 100. The filter circuit 20 may be a receiving filter that passes reception signals from the common terminal 100 to the input/output terminal 120.

The circuitry described above may cause unwanted signals, for example, harmonic waves of high-power transmission signals on a route passing through the input/output terminal 110 and the common terminal 100. The unwanted signals may flow into a reception path between the common terminal 100 and the input/output terminal 120, and as a result, the reception sensitivity associated with radio-frequency signals in the second frequency band may degrade. As a work around, the additional circuit 30 is able to significantly reduce or prevent unwanted signals, for example, harmonic waves transmitted between the input/output terminals 110 and 120. Accordingly, the possibility that the reception sensitivity in the second frequency band will degrade is able to be significantly reduced or prevented.

The additional circuit 30 generates signals that cancel unwanted signals lying in a predetermined frequency band and transmitted between the input/output terminals 110 and 120.

Consequently, unwanted signals transmitted between the input/output terminals 110 and 120 may be attenuated by the additional circuit 30.

Preferred embodiments, examples, and modifications thereof have been described so far as examples of the multiplexer according to the preferred embodiments of the present invention. However, the preferred embodiments of the present invention are not limited to the preferred embodiments, examples, and modifications. The present invention also includes other preferred embodiments implemented by varying combinations of components of the aforementioned preferred embodiments, examples, and modifications; other modifications provided by various alterations to the preferred embodiments above that may be conceived by those skilled in the art within a range not departing from the spirit of the present invention; and various types of apparatuses including the multiplexer according to the preferred embodiments of the present invention.

For example, inductors and capacitors may be connected between the individual components of the multiplexer. An example of an inductor is a wire inductor including a wire that provides a connection between the individual components.

The preferred embodiments of the present invention, or more specifically, a high-isolation multiplexer compliant with standards that are able to support multiple frequency bands has wide applicability to communication apparatuses, for example, mobile phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer, comprising:
a common terminal, a first input/output terminal, and a second input/output terminal through which radio-frequency signals are input or output;
a first filter circuit including a first terminal connected to the common terminal and a second terminal connected to the first input/output terminal, the first filter circuit being a filter including a pass band that is a first frequency band;
a second filter circuit including a third terminal connected to the common terminal and a fourth terminal connected to the second input/output terminal, the second filter circuit being a filter including a pass band that is a second frequency band different from the first frequency band; and
an additional circuit connected between the fourth terminal and one of the first and second terminals; wherein
the additional circuit includes:
a series-arm circuit on a series-arm path providing a connection between the fourth terminal and the one of the first and second terminals; and
a parallel-arm circuit on a parallel-arm path providing a connection between the series-arm path and ground; and
the parallel-arm circuit includes:
only an inductor in series with the parallel-arm path;
only a capacitor in series with the parallel-arm path; or
only an LC parallel resonant circuit that is in series with the parallel-arm path and that includes an inductor and a capacitor connected in parallel.

2. The multiplexer according to claim 1, wherein
the series-arm circuit includes a first series-arm circuit and a second series-arm circuit;
the parallel-arm circuit is on the parallel-arm path providing a connection between the ground and a connection node at which the first and second series-arm circuits are connected to each other;
the first and second series-arm circuits each include an inductor in series with the series-arm path; and
the parallel-arm circuit includes only a capacitor in series with the parallel-arm path.

3. The multiplexer according to claim 1, wherein
the series-arm circuit includes a first series-arm circuit and a second series-arm circuit;
the parallel-arm circuit is on the parallel-arm path providing a connection between the ground and a connection node at which the first and second series-arm circuits are connected to each other;
the first and second series-arm circuits each include a capacitor in series with the series-arm path; and
the parallel-arm circuit includes only an inductor in series with the parallel-arm path.

4. The multiplexer according to claim 1, wherein
the series-arm circuit includes a first series-arm circuit and a second series-arm circuit;
the parallel-arm circuit is on the parallel-arm path providing a connection between the ground and a connection node at which the first and second series-arm circuits are connected to each other;
the first and second series-arm circuits each include an LC parallel resonant circuit being in series with the series-arm path and including an inductor and a capacitor connected in parallel; and
the parallel-arm circuit includes only an LC parallel resonant circuit being in series with the parallel-arm path and including an inductor and a capacitor connected in parallel.

5. The multiplexer according to claim 1, wherein
the parallel-arm circuit includes:
  a first parallel-arm circuit on a first parallel-arm path providing a connection between the ground and the one of the first and second terminals; and
  a second parallel-arm circuit on a second parallel-arm path providing a connection between the fourth terminal and the ground;
the series-arm circuit includes an inductor in series with the series-arm path;
the first parallel-arm circuit includes only a capacitor in series with the first parallel-arm path; and
the second parallel-arm circuit includes only a capacitor in series with the second parallel-arm path.

6. The multiplexer according to claim 1, wherein
the parallel-arm circuit includes:
  a first parallel-arm circuit on a first parallel-arm path providing a connection between the ground and the one of the first and second terminals; and
  a second parallel-arm circuit on a second parallel-arm path providing a connection between the fourth terminal and the ground;
the series-arm circuit includes a capacitor in series with the series-arm path;
the first parallel-arm circuit includes only an inductor in series with the first parallel-arm path; and
the second parallel-arm circuit includes only an inductor in series with the second parallel-arm path.

7. The multiplexer according to claim 1, wherein
the parallel-arm circuit includes:
  a first parallel-arm circuit on a first parallel-arm path providing a connection between the ground and the one of the first and second terminals; and
  a second parallel-arm circuit on a second parallel-arm path providing a connection between the fourth terminal and the ground;
the series-arm circuit includes an LC parallel resonant circuit that is in series with the series-arm path and that includes an inductor and a capacitor connected in parallel;
the first parallel-arm circuit includes only an LC parallel resonant circuit that is in series with the first parallel-arm path and that includes an inductor and a capacitor connected in parallel; and
the second parallel-arm circuit includes only an LC parallel resonant circuit that is in series with the second parallel-arm path and that includes an inductor and a capacitor connected in parallel.

8. The multiplexer according to claim 1, wherein a radio-frequency signal in the first frequency band and a radio-frequency signal in the second frequency band are simultaneously or substantially simultaneously transmitted through the first filter circuit and the second filter circuit, respectively.

9. The multiplexer according to claim 1, wherein a frequency spacing between the first and second frequency bands is greater than one of band widths of the first and second frequency bands that is smaller than the other.

10. The multiplexer according to claim 1, wherein
the first filter circuit is a transmitting filter that passes transmission signals from the first input/output terminal to the common terminal; and
the second filter circuit is a receiving filter that passes reception signals from the common terminal to the second input/output terminal.

11. The multiplexer according to claim 1, wherein the additional circuit generates signals that cancel unwanted signals in a predetermined frequency band and transmitted between the first and second input/output terminals.

12. The multiplexer according to claim 11, wherein the signals generated by the additional circuit are in or substantially in antiphase to the unwanted signals.

13. The multiplexer according to claim 1, wherein at least one of the first and second filter circuits is an acoustic wave filter, an LC resonator filter, or a dielectric filter.

14. The multiplexer according to claim 1, wherein the additional circuit does not include an LC series resonant circuit on the parallel-arm path.

15. The multiplexer according to claim 1, wherein inductors and capacitors of the additional circuit are defined by surface-mount components, planar electrodes in a multilayer substrate, planar coil patterns in a multilayer substrate, or electrode wiring.

16. The multiplexer according to claim 1, wherein
the transmission signals are provided in a plurality of frequency bands; and
the reception signals are provided in a plurality of frequency bands.

* * * * *